United States Patent [19]

Shirai et al.

[11] Patent Number: 5,194,518
[45] Date of Patent: Mar. 16, 1993

[54] THERMOSETTING RESIN COMPOSITION COMPRISING PERFLUORO CONTAINING AMINE TERMINATED OLIGOMER AND POLYMALEIMIDE

[75] Inventors: Mitsuyoshi Shirai; Yasuo Kihara; Michiharu Yamamoto; Tadashi Nishikimi, all of Osaka, Japan

[73] Assignee: Nitto Denko Corporation, Osaka, Japan

[21] Appl. No.: 884,892

[22] Filed: May 18, 1992

Related U.S. Application Data

[63] Continuation of Ser. No. 574,973, Aug. 30, 1990, abandoned.

[30] Foreign Application Priority Data

Sep. 1, 1989 [JP] Japan .................................. 1-227750
Jun. 11, 1990 [JP] Japan .................................. 2-153492

[51] Int. Cl.$^5$ .............................................. C08G 73/10
[52] U.S. Cl. .................................. 525/426; 428/473.5; 525/436; 528/170; 528/229; 528/322
[58] Field of Search ................. 525/426, 436; 528/170, 528/229, 322

[56] References Cited

U.S. PATENT DOCUMENTS 3,842,143 10/1974 Winter ................................. 525/426

Primary Examiner—Harold D. Anderson
Attorney, Agent, or Firm—Sughrue, Mion, Zinn Macpeak & Seas

[57] ABSTRACT

A thermosetting resin composition, and a resin sheet, a prepreg and a laminated sheet using the composition are disclosed, which composition comprises (A) an amine-terminated oligomer represented by formula (I):

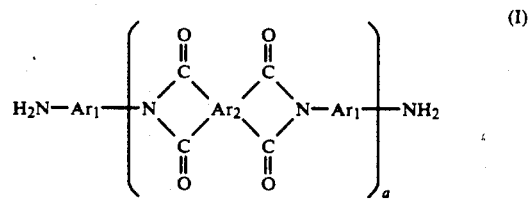

wherein $Ar_1$ represents a divalent aromatic group, $AR_2$ represents a tetravalent aliphatic or aromatic group, and a represents an integer of at least 1; and (B) a polymaleimide represented by formula (II):

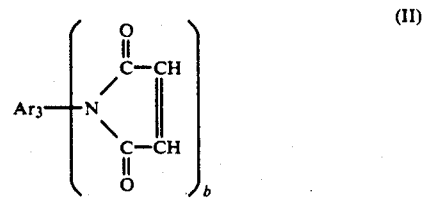

wherein $Ar_3$ represents an aliphatic group having two or more carbon atoms or an aromatic group, and b represents an integer of at least 2, provided that a part of the whole of hydrogen atoms of at least one group of $Ar_1$, $Ar_2$ and $Ar_3$ in formulae (I) and (II) is substituted by fluorine atoms.

5 Claims, 1 Drawing Sheet

THERMOSETTING RESIN COMPOSITION COMPRISING PERFLUORO CONTAINING AMINE TERMINATED OLIGOMER AND POLYMALEIMIDE

This is a continuation of application Ser. No. 07/574,973, filed Aug. 30, 1990, now abandoned.

FIELD OF THE INVENTION

This invention relates to a thermosetting resin composition, a resin sheet, a prepreg and a laminated sheet which have high heat resistance and are excellent in through-hole bonding reliability, dimensional stability, processability and electrical characteristics.

BACKGROUND OF THE INVENTION

It has been demanded to provide organic materials having excellent heat resistance as well as excellent flexibility as materials for electrical apparatuses and electronic equipment with a tendency to larger capacity, smaller-sized weight reduction or higher reliability and higher density in recent years.

Polyaminobismaleimide resins (e.g., polyimide resins composed of N,N'-diphenylmethanebismaleimide and 4,4'-diaminodiphenylmethane described in JP-B-46-23250) (the term "JP-B" as used herein means an examined Japanese patent publication") have been conventionally used in the field of heat-resistant laminated sheets for which high heat resistance, through-hole bonding reliability, dimensional stability, electrical characteristics are required.

However, the cured articles of the above-mentioned resins have problems in that heat resistance, flexibility and dielectric properties are lowered.

In addition, the polyaminobismaleimide resins have poor solubility and are dissolved in only polar organic solvents having a very high boiling point so that they have problems in drying stage and pressing when substrates are impregnated with them to prepare prepregs.

With the development of large-sized computers in particular, the dielectric constant of substrates must be lowered to speed up the signal transfer speed of computers as is clear from the following formula.

$$Vs \text{ (transfer speed)} = \frac{C \text{ (velocity of light)}}{\sqrt{\epsilon r \text{ (dielectric constant of dielectric material)}}}$$

Under the circumstances, polyimide resins and fluoro resins excellent in heat resistance, flexibility and electrical properties are drawing attention.

However, the substrates of the former polyimide resins have a dielectric constant of as high as 4 or higher at a frequency of 1 MHz. The substrates of the latter fluoro resins have a dielectric constant of about 2.5 and are considered to have an appropriate characteristic value. However, the latter have disadvantages in that processability and dimensional stability are inferior, particularly dimensional stability under high-temperature conditions in multi-layering stage during the preparation of multi-layer circuit boards is very inferior.

The present invention has been accomplished with the view of solving the above-described problems associated with prior arts.

SUMMARY OF THE INVENTION

An object of the present invention is to provide a thermosetting resin composition which is excellent in heat resistance, flexibility and processability and has low dielectric constant properties, obtained by incorporating a specific polymaleimide in a specific amine-terminated imide oligomer.

Another object of the present invention is to provide a resin sheet obtained by shaping the above-described thermosetting resin composition.

Still another object of the present invention is to provide a prepreg obtained by impregnating a substrate such as glass cloth or polyamide fiber as a reinforcing material with the above-described thermo-setting resin composition.

Still a further object of the present invention is to provide a laminated sheet which is excellent in heat resistance and flexibility as well as dimensional stability and has greatly improved low dielectric constant properties, obtained by using the aforesaid resin sheet or prepreg.

Other objects and effects of the present invention will be apparent from the following description.

Accordingly, the present invention provides in one aspect a thermosetting resin composition comprising (A) an amine terminated oligomer represented by formula (I):

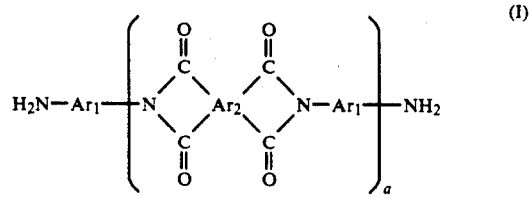

wherein $Ar_1$ represents a divalent aromatic group, $Ar_2$ represents a tetravalent aliphatic or aromatic group and a represents an integer of at least 1; and (B) a polymaleimide represented by formula (II):

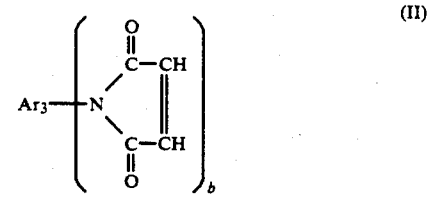

wherein $Ar_3$ represents an aliphatic group having two or more carbon atoms or an aromatic group and b represents an integer of at least 2, provided that a part of the whole of hydrogen atoms of at least one group of $Ar_1$, $Ar_2$ and $Ar_3$ in formulae (I) and (II) is substituted by fluorine atoms.

The present invention provides in another aspect a resin sheet formed from an organic solvent solution of the aforesaid thermosetting resin composition.

The present invention provides in still another aspect a prepreg comprising a substrate having impregnated or coated with the aforesaid thermosetting resin composition.

The present invention provides in a still further aspect a laminated sheet formed by laminating the aforesaid resin sheet or prepreg.

DETAILED DESCRIPTION OF THE INVENTION

Figure 1:
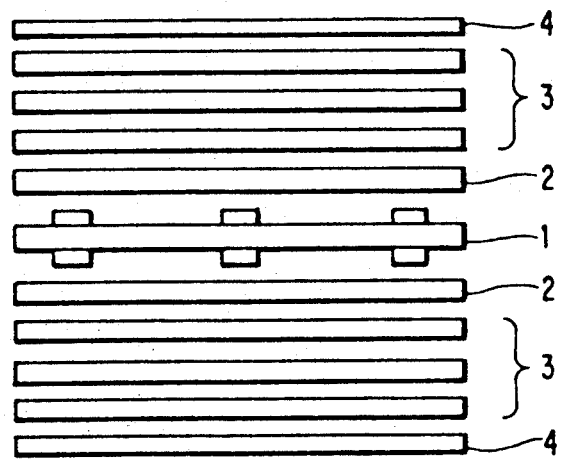
FIG. 1 is a schematic side view of a laminated sheet according to the present invention wherein numeral 1 shows an internal substrate, 2 shows resin sheet having a low dielectric constant, 3 shows prepreg and 4 shows copper foil.

In the thermosetting resin composition of the invention, there are preferred those wherein $Ar_1$ and $Ar_3$ in formulae (I) and (II) are each a group represented by formula (III):

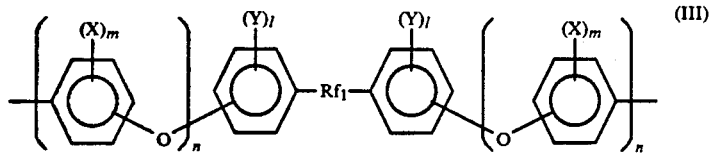

(III)

wherein $Rf_1$ represents a perfluoroalkylene group, X and Y may be the same or different groups and each represents at least one member selected from the group consisting of an alkyl group and a fluorinated alkyl group, n represents 0 or 1, m represents an integer of 0 to 4 and l represents an integer of 0 to 4. $Rf_1$ preferably represents

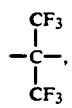

and X and Y each preferably represents $-CH_aF_{3-a}$ (wherein a is 0, 1, 2 or 3), $-(CH_2)_bCH_3$ (wherein b represents an integer of from 1 to 10) or $-(CF_2)_cCF_3$ (wherein c represents an integer of from 1 to 10) which may be a straight chain group or a branched chain group. X and Y each more preferably represents $-CH_3$, $-CH_2CH_3$, $-CF_3$ or $-CHF_2$.

Further, in the thermosetting resin composition of the present invention, there are preferred those wherein $Ar_2$ in the formula (I) is a group represented by the following formula

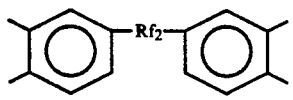

wherein $Rf_2$ is a member selected from the group consisting of a perfluoroalkylene group

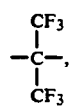

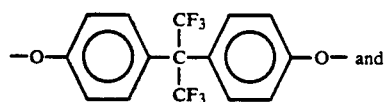

-continued

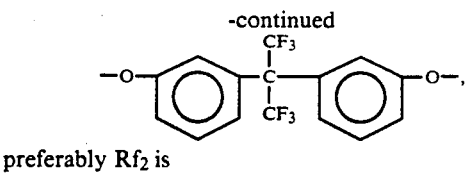

preferably $Rf_2$ is

The blending ratio of the amino-terminated oligomer (A) of formula (I) and the polymaleimide (B) is preferably such that the amount of the component (B) is in the range of 20 to 500 parts by weight based on 100 parts by weight of the component (A). When they are used in the above blending ratio, the resulting composition is excellent in various characteristics (e.g., heat resistance, flexibility, low relative dielectric constant, low dielectric loss and dimensional stability) and has good processability.

The resin sheet of the present invention is formed from an organic solvent solution containing the aforesaid thermosetting resin composition.

The prepreg of the present invention is formed by impregnating or coating a substrate with the aforesaid thermosetting resin composition.

The laminated sheet of the present invention is formed by laminating the aforesaid resin sheet or prepreg. In another embodiment, the laminated sheet of the present invention is formed by laminating the aforesaid resin sheet or prepreg onto a copper foil.

The present invention will be illustrated in more detail below.

The amine-terminated oligomer which is an essential ingredient in the thermosetting resin composition of the present invention is represented by formula (I).

Fluoro-oligomers where $Ar_1$ in formula (I) is a group represented by formula (III) are preferred.

Examples of $Ar_1$ represented by formula (III) include the following groups.

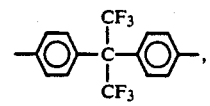

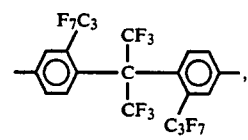

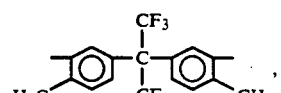

-continued

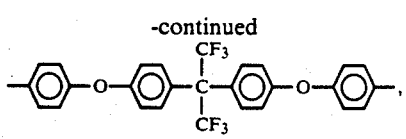

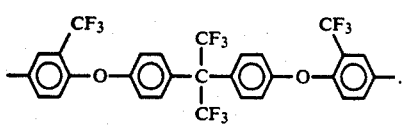

Further, there are preferred oligomers where $Ar_2$ in formula (I) is a group represented by the following formula

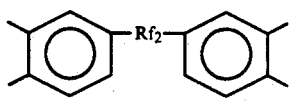

wherein $Rf_2$ is a member selected from the group consisting of a perfluoroalkylene group

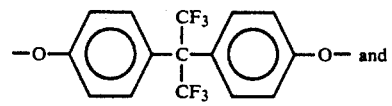

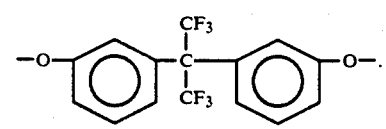

Typical examples of the amine-terminated oligomers having the above-described repeating units, represented by the formula (I) include the following compounds.

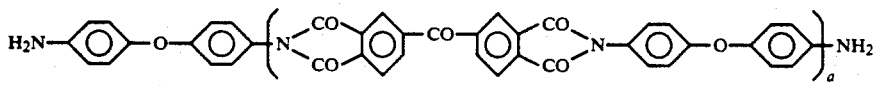

(PI(4,4'-DDE,BTDA)amine)

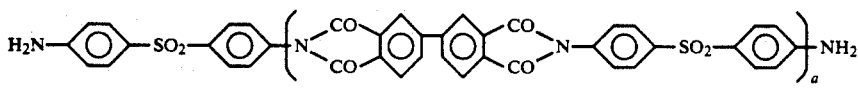

(PI(4,4'-DDS,BPDA)amine)

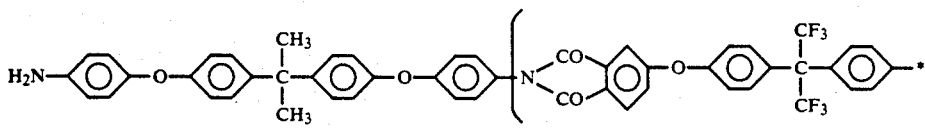

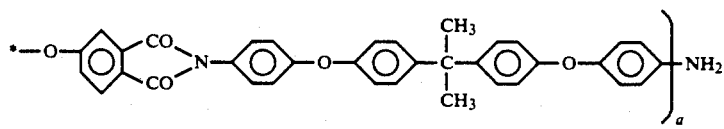

(PI(BAPP,4BPF)amine)

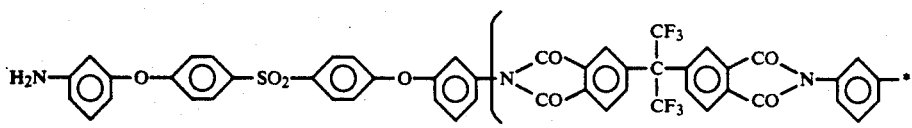

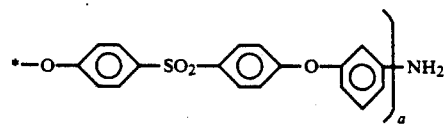

(PI(3,3'-BAPS,6FDA)amine)

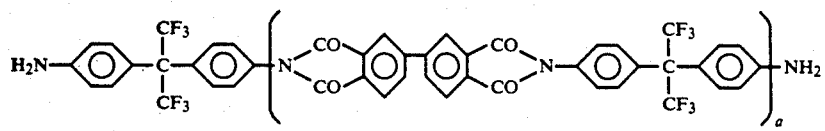

-continued
(PI(BAAF,BPDA)amine)
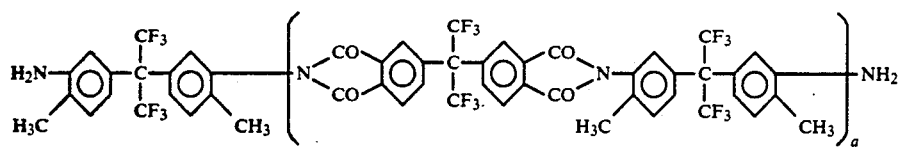
(PI(ATAF,6FDA)amine)
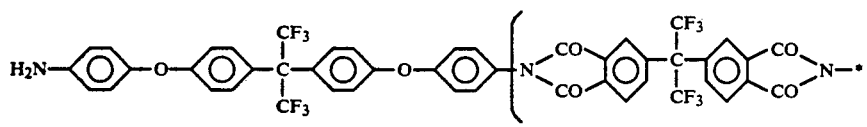
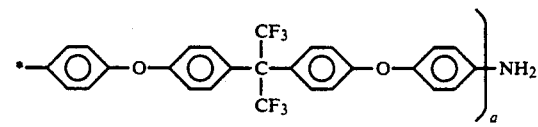
(PI(BAPF,6FDA)amine)
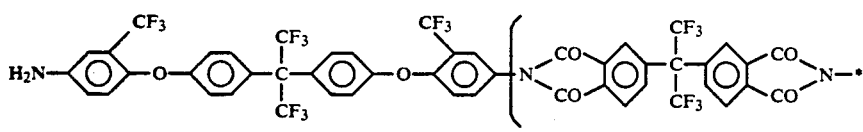
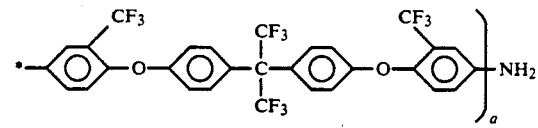
(PI(DTFA,6FDA)amine)
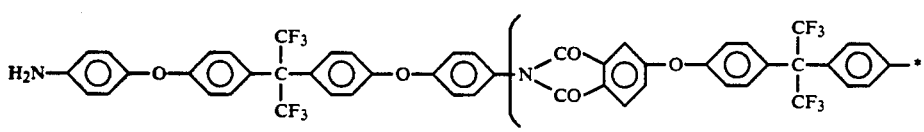
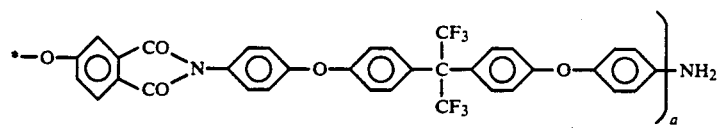
(PI(BAPF,4BPF)amine)
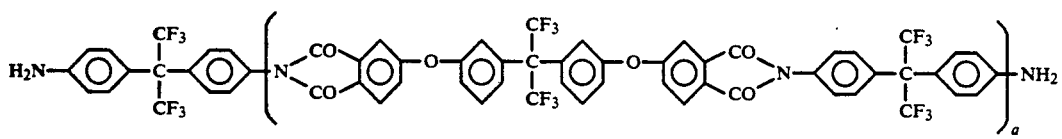
(PI(BAAF,3BPF)amine)
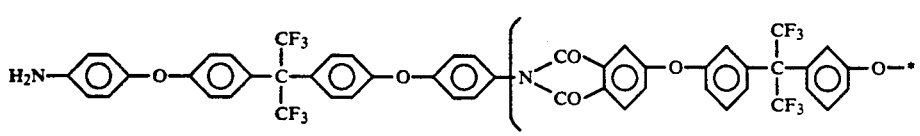

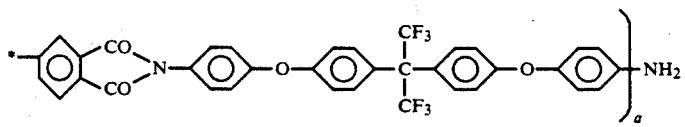

(PI(BAPF,3BPF)amine)

The amine-terminated imide oligomer may be in the form of an amine-terminated co-oligomer obtained by using two or more diamine components or two or more acid components or in the form of a mixture of two or more amine-terminated oligomers.

Namely, it is necessary that in the amine-terminated oligomer of formula (I), a is an integer of at least 1 from the viewpoints of the heat resistance, flexibility and low dielectric properties of cured products. However, aromatic diamine where a is 0 may be contained.

In the present invention, the aforesaid amine-terminated imide oligomers are amine-terminated imide oligomers obtained by reacting a diamine component (x mol) with an acid component (y mol) composed of a tetracarboxylic acid or a derivative thereof in an organic solvent, said diamine component and said acid component being used in a molar ratio of $1 < x/y \leq 4$, preferably $1 < x/y \leq 1.5$ so that the terminals of the resulting oligomer are amino groups and an oligomer having an appropriate degree of polymerization is synthesized. The resulting amine-terminated oligomers preferably have an inherent viscosity of not higher than 1.0 (dl/g), more preferably 0.05 to 0.8 (dl/g), and particularly preferably 0.1 to 0.6 (dl/g).

When the inherent viscosity exceeds 1 (dl/g), the viscosity is too high and there tends to be difficulty in impregnating the reinforcing substrate and as a result, there may be a difficulty in obtaining the prepreg. Further, the amount of the terminal amine becomes very small, it may be difficult to sufficiently react amino group with the polymaleimide and as a result, solvent resistance becomes poor. On the other hand, when the inherent viscosity is lower than 0.05 (dl/g), the flexibility, heat resistance, dimensional stability and electrical characteristics of cured products tend to be deteriorated.

The inherent viscosity used herein is calculated by the following formula wherein viscosity is measured by a capillary viscometer (0.5 (g/dl) in N-methyl-2-pyrrolidone at 30° C.).

$$\text{Inherent viscosity} = \frac{\text{Natural logarithm} \left( \frac{\text{viscosity of solution}}{\text{viscosity of solvent}} \right)}{\text{Concentration of polymer in solution}}$$

As tetracarboxylic acids and derivatives thereof which can be used as the acid component, examples of tetracarboxylic acids having no fluorine atom and derivatives thereof which can be used in the present invention include aliphatic tetracarboxylic acids such as butanetetracarboxylic acid, ethylenetetracarboxcylic acid, propanetetracarboxylic acid, cyclobutanetetracarboxylic acid, cyclopentanetetracarboxylic acid, cyclohexanetetracarboxylic acid and 5-(2,5-dioxotetrahydrofuryl)-3-methyl-3-cyclohexene-1,2-dicarboxylic acid; aromatic tetracarboxylic acids such as pyromellitic acid, benzophenonetetracarboxylic acid, naphthalene-2,3,6,7-tetracarboxylic acid, naphthalene-1,2,4,5-tetracarboxylic acid, naphthalene-1,4,5,8-tetracarboxylic acid, 3,3',4,4'-diphenyltetracarboxylic acid, naphthalene-1,3,5,6-tetracarboxylic acid, 2,2',3,3'-diphenyltetracarboxylic acid, 3,4,9,10-perylenetetracarboxylic acid, bis(3,4-dicarboxyphenyl) ether, decahydronaphthalene-1,4,5,8-tetracarboxylic acid, 4,8-dimethyl-1,2,3,5,6,7-hexahydronaphthalene-1,2,5,6-tetracarboxylic acid, 2,6-dichloronaphthalene-1,4,5,8-tetracarboxylic acid, 2,7-dichloronaphthalene-1,4,5,8-tetracarboxylic acid, 2,3,6,7-tetrachloronaphthalene-1,4,5,8-tetracarboxylic acid, phenanthrene-1,8,9,10-tetracarboxylic acid, 2,3,4,5-pyrrolidinetetracarboxylic acid, 2,3,5,6-pyrazinetetracarboxylic acid, thiophentetracarboxylic acid, 2,2-bis(3,4-dicarboxyphenyl) propane, 2,2-bis(2,3-dicarboxyphenyl)propane, 1,1-bis(2,3-dicarboxyphenyl)ethane, 1,1-bis(3,4-dicarboxyphenyl)ethane, bis(2,3-dicarboxyphenyl)methane, bis(3,4-dicarboxyphenyl)methane and bis(3,4-dicarboxyphenyl)sulfone; and their derivatives such as acid dianhydrides, acid halides, monoesters and diesters.

Tetracarboxylic acids having alkyl or alkylene group where the whole of hydrogen atoms in the alkyl group or alkylene chain is substituted by fluorine atom can be used as fluorinated tetracarboxylic acids or derivatives thereof. Examples of the fluorinated tetracarboxylic acids and derivatives thereof which can be used in the present invention include fluorinated aromatic tetracarboxylic acids such as bis(3,4-dicarboxyphenyl)-difluoromethane, 1,3-bis(3,4-dicarboxyphenyl)-hexafluoropropane, 1,4-bis(3,4-dicarboxyphenyl) octafluorobutane, 1,5-bis(3,4-dicarboxyphenyl)decafluoropentane, 1,6-bis(3,4-dicarboxyphenyl)dodecafluorohexane, 2,2-bis(3,4-dicarboxyphenyl)hexafluoropropane, 2,2-bis(4-(3,4-dicarboxyphenoxy)phenyl)hexafluoropropane and 2,2-bis(3-(3,4-dicarboxyphenoxy)phenyl)-hexafluoropropane and derivatives thereof. Among them, 2,2-bis(3,4-dicarboxyphenyl)hexafluoropropane, 2,2-bis(4-(3,4-dicarboxyphenoxy)phenyl)hexafluoropropane, 2,2'- bis(3-(3,4-dicarboxyphenoxy)phenyl)hexafluoropropane and acid dianhydrides thereof, acid halides thereof, monoesters thereof and diesters thereof are preferred for the purpose of low dielectric constant.

Among diamine components to be reacted with the acid component, examples of diamines having no fluorine atom which can be used in the present invention include aliphatic diamines such as 2,2-dimethylpropylenediamine, 2,5-dimethylhexamethylenediamine, 2,5-dimethylheptamethylenediamine, 4,4'-dimethylheptamethylenediamine, 3-methylheptamethylenediamine, 5-methylnonamethylenediamine, 1,17-eicosadecylenediamine, 1,4-diaminocyclohexane, 1,10-diamino-1,10-dimethyldecane, 2,11-diaminododecane, 1,12-diaminooctadecane, diaminopropyltetramethylenediamine, 1,2-bis(3-aminopropoxy)ethane, 3-methoxyhexamethylenediamine, hexamethylenediamine, heptamethylenediamine, octamethylenediamine, nonamethylenediamine and decamethylenediamine; and aromatic diamines such as p-phenylenediamine, o-phenylenediamine, diaminotoluene, 2,4-diaminotoluene, 4,4'-diaminodiphenylmethane, benzidine, 3,3'-dimethylbenzidine, 3,3'-dimethoxybenzidine, 4,4'-diaminodiphenyl sulfide, 4,4'-diaminodiphenyl sulfone, 3,3'-diaminodiphenyl, 3,3'-diaminodiphenyl sulfone, 4,4'-diaminodiphenylketone, 4,4'-diaminodiphenyl ether, 1,4-diaminonaphthalene, 1,5-diaminonaphthalene, 2,4-bis($\beta$-amino-tert-butyl)toluene, bis(p-$\beta$-amino-tert-butylphenyl) ether, bis(p-$\beta$-methyl-$\Delta$-amino-phenyl)-benzene, bis(p-1,1-dimethyl-tert-aminopentyl)benzene, bis(p-1,1-dimethyl-tert-aminopentyl)benzene, 1-isopropyl-2,4-m-phenylenediamine, m-xylenediamine, bis(4-aminophenyl)d,d'-p-xylenediamine, bis[4-(3-aminophenoxy)phenyl]sulfone and 2,2-bis[4-(4-aminophenoxy)phenyl]propane. Diisocyanates obtained by modifying these diimines may be used in the present invention.

Diamines having alkyl or alkylene group where the whole of hydrogen atoms of the alkyl group or the alkylene chain is substituted by fluorine atom can be used as fluorinated diamine components. Examples of the fluorinated diamines which can be used in the present invention include fluorinated binuclear aromatic diamines such as 1,3-bis(anilino)hexafluoropropane 1,4-bis(anilino)octafluorobutane, 1,5-bis(anilino)decafluoropentane, 1,7-bis(anilino)tetradecafluoroheptane, 2,2-bis(4-aminophenyl)hexafluoropropane, 2,2-bis(3-aminophenyl)hexafluoropropane, 2,2-bis(3-amino-4-methylphenyl)hexafluoropropane and 2,2-bis(4-amino-3-methylphenyl)hexafluoropropane; and fluorinated tetranuclear aromatic diamines such as 2,2-bis(4-(4-aminophenoxy)phenyl)hexafluoropropane, 2,2-bis(4-(3-aminophenoxy)phenyl)hexafluoropropane, 2,2-bis(4-(2-aminophenoxy)phenyl)hexafluoropropane, 2,2-bis(4-(2-aminophenoxy)-3,5-dimethylphenyl]hexafluoropropane, 2,2-bis(4-(4-amino-2-trifluoromethylphenoxy)-phenyl)hexafluoropropane, 2,2-bis(3-(3-aminophenoxy)phenyl)hexafluoropropane, 1,3-bis(4-(4-aminophenoxy)phenyl)hexafluoropropane, 1,3-bis(4-(3-aminophenoxy)phenyl)hexafluoropropane, 1,4-bis(4-(4-aminophenoxy)phenyl)octafluorobutane, 1,5-bis(4-(4-aminophenoxy)phenyl)decafluoropentane and 1,5-bis(4-(4-amino-2-trifluoromethylphenoxy)phenyl)hexafluoropentane.

Among these fluorinated aromatic diamines, there are preferred 2,2'bis(4-(4-aminophenoxy)phenyl)hexafluoropropane, 2,2-bis(4-aminophenyl)hexafluoropropane, 2,2-(3-amino-4-methylphenyl)hexafluoropropane and 2,2-bis(4-(4-amino-2-trifluoromethylphenoxy)-phenyl)hexafluoropropane for the purpose of low dielectric constant. These diamine components may be replaced by diisocyanates. These amines may be used either alone or in a combination of two or more of them.

Examples of organic polar solvents which can be used in the preparation of the amine-terminated imide oligomers of the present invention include amide solvents such as N,N-dimethylformamide, N,N-dimethylacetamide, N-methyl-2-pyrrolidone (NMP) and N-methylcaprolactam; sulfur atom-containing solvents such as dimethyl sulfoxide, hexamethylphosphoric triamide, dimethyl sulfone, tetramethylene sulfone and dimethyltetramethylene sulfone; phenol solvents such as cresol and phenol; and other solvents such as pyridine, ethylene glycol and tetramethylurea.

In addition to the above-described organic polar solvents, there can be preferably used organic polar solvents containing oxygen atom in the molecule such as dioxane, methyl ethyl ketone (MEK), monoglimes and diglimes for the reaction.

Further, the above-described organic solvents may be used together with aromatic hydrocarbon solvents such as benzene, toluene and xylene or other organic solvents such as solvent naphtha, benzonitrile, acetone and methanol.

The amine-terminated imide oligomers of the present invention can be obtained by a method wherein the acid component is reacted with the diamine component in the aforesaid organic polar solvent at a reaction temperature of not higher than about 100° C., preferably not higher than about 80° C. to form an oligomer having amido-acid bond and the resulting amido-acid oligomer (sometimes called "amic acid oligomer") is treated with an imidating agent at a low temperature of about 0° to 140° C. or is heated at a high temperature of 140° to 250° C. to effect dehydration and cyclization, thus forming an amine-terminated imide oligomer.

In a particularly preferred embodiment of preparing the amine-terminated imide oligomers, the acid component and the diamine component are uniformly dissolved in the above-described organic solvent and reacted with each other with stirring at a reaction temperature of about 5° to 60° C. for 1 to 180 minutes to form an amic acid oligomer, the temperature of the reaction mixture is raised to a temperature of 140° to 250° C., particularly preferably 140° to 180° C., the reaction mixture is stirred at that temperature for 30 to 500 minutes to carry out the imidation reaction of the amic acid oligomer and to thereby form an imide oligomer and finally the reaction mixture is cooled to about room temperature. It is preferred that all of reaction steps in this reaction are carried out in an inert gas atmosphere such as nitrogen gas or argon gas.

The thus-formed amine-terminated imide oligomer may be isolated as a powder product by pouring the reaction mixture into water, etc. and the powder product may be dissolved in the organic polar solvent and used as the occasion demands. Alternatively, the reaction mixture (solution) as such may be used or the reaction mixture may be concentrated or diluted and used as a solution of the amine-terminated imide oligomer.

In the present invention, a polymaleimide represented by formula (II):

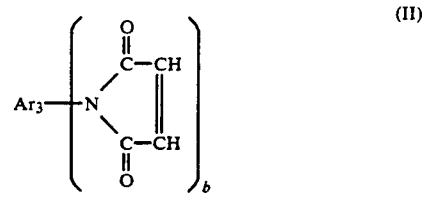

(wherein $Ar_3$ is an aliphatic group having two or more carbon atoms or an aromatic group, and b is an integer of at least 2) is used in combination with the above amine-terminated imide oligomer.

In the present invention, a part or the whole of hydrogen atoms of at least one group of $Ar_1$, $Ar_2$ and $Ar_3$ in formulae (I) and (II) must be Substituted by fluorine atoms.

Examples of the polymaleimide represented by formula (II) include N,N'-ethylenedimaleimide, N,N'-hexamethylenebismaleimide, N,N'-dodecamethylenebismaleimide, N,N'-m-xylylenebismaleimide, N,N'-p-xylylenebismaleimide, N,N'-1,3-bismethylenecyclohexanebismaleimide, N,N'-1,4-bismethylenecyclohexanebismaleimide, N,N'-2,4-tolylenebismaleimide, N,N'-

2,6-tolylenebismaleimide, N,N'-3,3'-diphenylmethanebismaleimide, N,N'-4,4'-diphenylmethanebismaleimide, 3,3'-diphenylsulfonebismaleimide, 4,4'-diphenylsulfonbismaleimide, N,N'-4,4'-diphenylsulfidobismaleimide, N,N'-p-benzophenonebismaleimide, N,N'-diphenylethanebismaleimide, N,N'-diphenyletherbismaleimide, N,N'-(methylene-ditetrahydrophenyl)bismaleimide, N,N'-(3-ethyl)-4,4'-diphenylmethanebismaleimide, N,N'-(3,3'-dimethyl)-4,4'-diphenylmethanebismaleimide, N,N'- (3,3'-diethyl)-diphenylmethanebismaleimide, N,N'-(3,3'dichloro)-4,4'-diphenylmethanebismaleimide, N,N'-tolidinebismaleimide, N,N'-isophoronebismaleimide, N,N'-p,p-diphenylmethylsilylbismaleimide, N,N'-benzophenonebismaleimide, N,N'-diphenylpropanebismaleimide, N,N'-naphthalenebismaleimide, N,N'-p-phenylenebismaleimide, N,N'-m-phenylenebismaleimide, N,N'-4,4'-(1,1-diphenylcyclohexane)bismaleimide, N,N'-3,5-(1,2,4-triazole)bismaleimide, N,N'-pyridine-2,6-diyl-bismaleimide, N,N'-5-methoxy-1,3-phenylenebismaleimide, 1,2-bis(2-maleimidoethoxy)-ethane, 1,3-bis(3-maleimidopropoxy)propane, N,N'-4,4'-diphenylmethane-bis-dimethylmaleimide, N,N'-hexamethylene-bis-dimethylmaleimide, N,N'-4,4'-(diphenylether)-bis-dimethylmaleimide, N,N'-4,4'-diphenylsulfone-bis-dimethylmaleimide, N,N'-bismaleimide of 4,4'-diamino-triphenyl phosphate and N,N'-bismaleimide of 4,4-diamino-triphenylthio phosphate.

Examples of fluorinated polymaleimides represented by formula (II) include fluorinated binuclear aromatic bismaleimides such as 1,3-bis(maleimido)hexafluoropropane, 1,4-bis(maleimido)octafluorobutane, 1,5-bis(-maleimido)decafluoropentane, 1,7-bis(maleimido)tetradecafluoroheptane, 2,2-bis(4-maleimidophenyl)hexafluoropropane, 2,2-bis(3-maleimidophenyl)hexafluoropropane, 2,2-(4-maleimidophenyl-3'-maleimidophenyl)-hexafluoropropane, 2,2-bis(3-maleimido-4-methylphenyl)hexafluoropropane, 2,2-bis(4-maleimido-3-methylphenyl)hexafluoropropane and 2,2-(3-maleimido-4-methylphenyl-4'-maleimido-3'-methylphenyl)hexafluoropropane; and fluorinated tetranuclear aromatic bismaleimides such as 2,2-bis(4-(4-maleimidophenoxy)phenyl)hexafluoropropane, 2,2-bis(4-(3-maleimidophenoxy)phenyl)hexafluoropropane, 2,2-bis(4-(2-maleimidophenoxy)phenyl)hexafluoropropane, 2,2-(4-(4-maleimidophenoxy)phenyl-4'-(3'-maleimidophenoxy)phenyl)hexafluoropropane, 2,2-bis(4-(2-maleimidophenoxy)-3,5-dimethylphenyl)hexafluoropropane, 2,2-bis[4-(4-maleimido-2-trifluoromethylphenoxy)phenyl)hexafluoropropane, 2,2-bis(3-(3-maleimidophenoxy)phenyl)hexafluoropropane, 1,3-bis(4-(4-maleimidophenoxy)phenyl)hexafluoropropane, 1,3-bis(4-(3-maleimidophenoxy))hexafluoropropane, 1,4-bis(4-(4-maleimidophenoxy)phenyl)octafluorobutane, 1,5-bis(4-(4-maleimidophenoxy)phenyl)decafluoropentane and 1,5-bis(4-(4-maleimido-2-trifluoromethylphenoxy))hexafluoropentane.

The polymaleimides represented by formula (II) can be prepared by reacting the aforesaid diamines with maleic anhydride in the following manner.

The bifunctional maleimides of the formula (II) according to the present invention can be synthesized from the diamines and maleic anhydride without particular limitation with regard to the synthesis method thereof. For example, in the first step, there is prepared a maleamic acid represented by formula (IV):

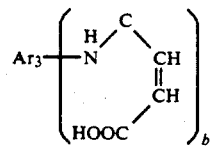

wherein Ar₃ and b are as defined in formula (II).

The reaction is advantageously carried out by bringing the starting materials into contact with each other in a solvent. Examples of solvents which can be generally used in the reaction include dimethylformamide, dimethylacetamide, dimethylsulfoxide, N-methyl-pyrrolidone, N-methylcaprolactam, tetrahydrofuran, dioxane, acetone and diethylketone. In the second step, the maleamic acid obtained above is subjected to dehydration and cyclization to form a maleimide. This reaction can be carried out by using known methods described in U.S. Pat. Nos. 3,018,290, 3,018,292 and 3,127,414.

In the dehydration of the maleamic acid of formula (IV), the dehydration reaction is preferably carried out in the presence of 1.05 to 1.5 mol of a tertiary amine (e.g., triethylamine) per mol of amic acid group and 0.05 to 0.5 mol of nickel acetate as a catalyst per mol of amic acid group in acetone as a solvent.

Examples of polymaleimides particularly suitable for use in the thermosetting resin compositions of the present invention include polyfunctional maleimides obtained by the reaction a reaction product (polyamine compound) between aniline and formalin, 3,4,4'-triaminodiphenylmethane, 3,3',4,4'-tetraaminodiphenylmethane, triaminophenol or the like with maleic anhydride and trifunctional maleimides obtained by the reaction of tris-(4-aminophenyl) phosphate or tris(4-aminophenyl)thio phosphate with maleic anhydride in addition to the above-described bifunctional maleimides. These polymaleimides may be used either alone or as a mixture of two or more of them, and the use of both one or more polymaleimides is an effective method in the present invention.

Among the amine-terminated oligomers and the polymaleimides, bismaleimides synthesized from the fluorinated diamines are preferred from the viewpoint of low dielectric constant.

The curing conditions of the thermosetting resin compositions of the present invention are such that heating is carried out at a temperature of 100° to 350° C. for one minute to 48 hours. However, the curing conditions are not limited thereto and other curing conditions may be used according to purpose and use.

The thermosetting resin compositions of the present invention may contain polymerization initiators to complete curing with shorter-time heating. Examples of the polymerization initiators include organic peroxides such as benzoyl peroxide, p-chlorobenzoyl peroxide, 2,4-dichlorobenzoyl peroxide, capryl peroxide, lauroyl peroxide, acetyl peroxide, methyl ethyl ketone peroxide, cyclohexanone peroxide, dicumyl peroxide, benzpinacol, bis(1-hydroxycyclohexyl peroxide), hydroxyheptyl peroxide, tert-butyl hydroperoxide, p-menthane hydroperoxide, tert-butyl perbenzoate, tert-butyl peracetate, tert-butyl peroctoate, tert-butyl peroxyisobutyrate and di-tert-butyl perphthalate. These compounds may be used either alone or as a mixture of two or more of them.

Basic catalysts such as tertiary amines, tertiary amine salts, quaternary ammonium salts or imidazoles or Lewis acid amine complex catalysts may be used in the thermosetting resin composition as anionic polymerization catalysts for the polymaleimides.

Examples of tertiary amines include pyridine type tert-amines such as pyridine, 2-chloropyridine, 2,4,6-collidine, 2,6-dichloropyridine, α,β,γ-picoline, 4-phenylpropylpyridine, 2-propylpyridine, 2,6-lutidine, 2,4-lutidine, 2,5-lutidine and 3,4-lutidine; aliphatic tert-amines such as triethylamine, tri-n-butylamine, tri-n-octylamine, benzylmethylamine, dimethylaminomethylphenol, trisdimethylaminomethylphenol, triethylenediamine, N,N,N',N'-tetramethylethylenediamine, tetramethylguanidine and heptanoylisoguanide; aromatic tert-amines such as N,N-dimethylaniline, N,N,N',N'-tetramethyldiaminodiphenylmethane, N,N,N',N'-tetramethyl-m-phenylenediamine, N,N,N',N'-tetramethyl-p-phenylenediamine and N,N-dimethyl-p-toluidine; and triphenylphosphine, 1,8-diazobicyclo[5,4,0]undecene-7 and acid complex thereof.

Examples of the tertiary amine salts include triacetate or tribenzoate salts of the above-described tertiary amines.

Examples of the quaternary ammonium salts include tetramethylammonium chloride, tetramethylammonium bromide, tetraethylammonium chloride, tetraethylammonium bromide, trimethylcetylammonium chloride, trimethylcetylammonium bromide, triethylcetylammonium chloride, triethylcetylammonium bromide and tetraethylammonium iodide.

Examples of the imidazoles include 2-methylimidazole, 2-ethyl-4-methyl-imidazole, 2-phenylimidazole, 2-undecylimidazole, 2-ethylimidazole, 2,4-dimethylimidazole, 2-isopropylimidazole, and azine derivatives thereof, trimellitic acid derivatives thereof and nitrileethyl derivatives thereof.

Examples of the Lewis acid amine complexes include complexes of Lewis acid such as $BF_3$, $ZnCl_2$, $AlCl_3$, $SiCl_4$, $SnCl_4$ or $FeCl_3$ with an amine compound such as monoethylamine, n-hexylamine, benzylamine, triethylamine, aniline or piperidine.

These basic catalysts may be used either alone or in a combination of two or more of them.

Further, Brønsted acids and Lewis acids are used as acid catalysts for Michael addition reaction of the amine-terminated oligomer to the double bonds of the polymaleimide.

Examples of Brønsted acids includes phenols such as phenol, cresol, fluorophenol, chlorophenol, aminophenol, nitrophenyl, 2,4-dinitrophenol, 2,4,6-trinitrophenol, benzenediol, 2,2-bis(4-hydroxyphenyl)propane bis(4-hydroxyphenyl)methane, bis(4-hydroxyphenyl) sulfone, and 2,2-bis(4-hydroxyphenyl)hexafluoropropane; aliphatic carboxylic acids such as acetic acid, propionic acid, lauric acid, stearic acid, oleic acid, linoleic acid, adipic acid, decanedicarboxylic acid, tridecanedicarboxylic acid and pentadecanedicarboxylic acid; and aromatic carboxylic acids such as benzoic acid, toluic acid, fluorobenzoic acid, phthalic acid, salicylic acid, 2,2-bis(4-carboxyphenyl)propane and 2,2-bis(4-carboxyphenyl)hexafluoropropane.

Examples of Lewis acids include aluminum chloride, iron chloride, titanium chloride and metal salts of carboxylic acids such as tin caprylate. These acid catalysts may be used either alone or as a mixture of two or more of them.

In the present invention, it is possible that known chain transfer agents such as mercaptans, sulfides, β-diketones, metal chelates and metallic soap are used for the above-described polymerization catalysts. If desired, conventional radical polymerization inhibitors such as quinones (e.g., p-benzoquinone, naphthoquinone, phenanthraquinone), phenols (e.g., hydroquinone, p-tert-butyl catechol, 2,5'-di-tert-butylhydroquinone), nitro compounds and metal salts may be used to improve the storage stability of the thermosetting compositions at room temperature.

Further, the thermosetting resin compositions of the present invention may contain various materials according to the use thereof. When the compositions are used as molding materials, inorganic fillers such as zirconium oxide, silica, alumina, aluminum hydroxide, titania, zinc flower, calcium carbonate, magnesite, cloy, kaolin, talc, siliceous sand, glass, fused quartz glass, asbestos, mica, various whiskers, carbon black, graphite and molybdenum disulfide, parting agents such as higher fatty acids and wax, and coupling agents such as epoxysilane, vinyl silane, borane and alkoxy titanate compounds are added. The amount of the fillers is preferably from 0 to 90 parts by weight per 100 parts by weight of the thermosetting resin composition. If desired, flame retarders such as halogenated compounds, antimony oxide and phosphorus compounds may be added.

The compositions of the present invention can be used as solutions such as varnish. Examples of solvents for use in preparing the solutions such as varnish include N-methyl-2-pyrrolidone, N,N-dimethylacetamide, N,N-dimethylformamide, N,N-diethylformamide, N-methylformamide, diethyl sulfoxide, N,N-diethylacetamide, N,N-dimethylmethoxyacetamide, hexamethylphosphoric triamide, pyridine, dimethyl sulfone, tetramethyl sulfone, dimethyltetramethylene sulfone and phenolic solvents such as phenol, cresol and xylenol.

These solvents may be used either alone or as a mixture of two or more of them.

If desired, the above-described solvents may be used together with aromatic hydrocarbon solvents such as benzene, toluene and xylene or other organic solvents such as solvent naphtha, benzonitrile, acetone, methyl ethyl ketone, diethyl ketone, chloroform, dioxane and methanol.

The blending ratio of the amine-terminated oligomer (A) of formula (I) and the polymaleimide (B) of formula (II) in the thermosetting resin composition of the present invention is such that the amount of the component (B) is in the range of 15 to 600 parts by weight, preferably 20 to 500 parts by weight per 100 parts by weight of the component (A). When the amount of the component (B) to be blended is less than 15 parts by weight per 100 parts by weight of the component (A), solvent resistance becomes poor and a coefficient of linear expansion is remarkably increased, while when the amount of the component (B) is more than 600 parts by weight per 100 parts by weight of the component (A), flexibility, processability, heat resistance and electrical properties are deteriorated and there is a possibility that such a large amount has an adverse effect on practical use.

In the thermosetting resin compositions of the present invention, there are preferred those wherein $Ar_1$ and $Ar_3$ in formulae (I) and (II) are each a group represented by formula (III):

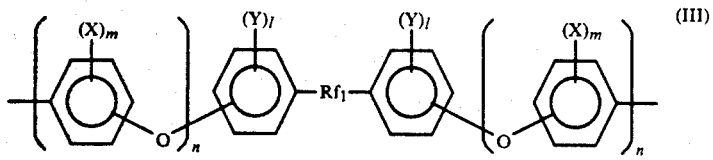

(III)

wherein $Rf_1$ is a perfluoroalkylene group, X and Y may be same or different groups and each is at least one member selected from the group consisting of an alkyl group and a fluorinated alkyl group, n represents 0 or 1, m represents an integer of 0 to 4 and l represents an integer of 0 to 4.

When $Ar_1$ and $Ar_3$ are each a group of formula (III), fluorinated thermosetting resin compositions excellent in electrical properties as well as in heat resistance, flexibility and dimensional stability can be obtained.

Examples of $Ar_1$ and $Ar_3$ represented by formula (III) include the following groups.

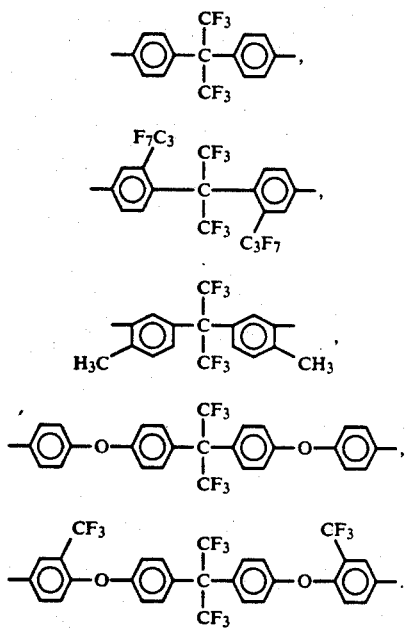

In the thermosetting resin compositions of the present invention, there are also preferred those wherein $Ar_2$ in formula (I) is a group represented by the following formula

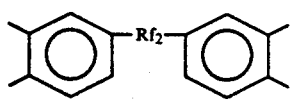

wherein $Rf_2$ is a member selected from the group consisting of a perfluoroalkylene group

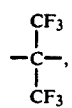

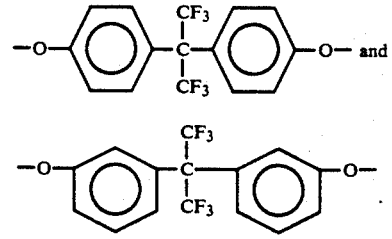

By selecting $Ar_1$, $Ar_2$ and $Ar_3$ as above, fluorinated thermosetting resin compositions excellent in electrical properties as well as in heat resistance, flexibility and dimensional stability can be obtained.

As the resin sheet or prepreg of the present invention, there are preferred the resin sheet formed from the organic solvent solution containing the thermosetting resin composition and the prepreg formed by impregnating or coating a substrate with the thermosetting resin composition, because there can be easily, inexpensively obtained the resin sheet and the prepreg which have high heat resistance and are excellent in such properties as through-hole bonding reliability, dimensional stability, processability and electrical characteristics without requiring any special device or technique.

General method for preparing the resin sheet or prepreg of the present invention is illustrated below.

First, the thermosetting resin composition of the present invention is prepared, it is desirable that the prepolymer of the thermosetting resin composition is previously formed by subjecting the amine-terminated oligomer (A) of formula (I) and the polymaleimide (B) of formula (II) to a reaction (radical polymerization and Michael addition reaction) in the presence of a polymerization initiator or polymerization catalyst (C) at a temperature of 50° to 250° C., preferably 100° to 230° C. When the reaction temperature is lower than 50° C., the reaction rate is very low, a large amount of unreacted maleimide is left behind and as a result, the crystallization of maleimide is caused during the formation of sheet or impregnation step and there is a difficulty in obtaining a laminated sheet uniformly cured, while when the reaction temperature is higher than 250° C., the composition is caused to gel and there is a possibility that the composition has an adverse effect on practical use. Thus, a temperature of lower than 50° C. or higher than 250° C. is not preferred.

The degree of prepolymerization is preferably such an extent that vanish of the composition has a viscosity of 1,000 poise or less (20 wt % at 30° C.) in the case of resin sheets, and 100 poise or less 140 wt % at 30° C. in the case of pregregs. If the viscosity of the vanish exceeds the above ranges, the processability tends to be deteriorated.

By prepolymerizing the composition as mentioned above, dielectric properties and heat resistance are improved and it becomes possible that viscosity is easily adjusted during the sheet forming step and the impregnation step. However, it is not always necessary to prepare the prepolymer of the amine-terminated oligomer and the polymaleimide depending on solvents.

Examples of organic solvents which are used in the preparation of the prepolymer include amide solvents such as N,N-dimethylformamide, N,N-dimethylacetamide, N-methyl-2-pyrrolidone (NMP) and N-methylcaprolactam, sulfur-containing solvents such as dimethyl sulfoxide, hexamethylphosphoric triamide, dimethyl sulfone, tetramethylene sulfone and dimethyltetramethylene sulfone, phenol solvents such as cresol and phenol and other solvents such as pyridine, ethylene glycol and tetramethylurea.

For the above reaction, there can be used the organic polar solvents mentioned above. Further, organic polar solvents having oxygen atom in the molecule such as dioxane, methyl ethyl ketone (MEK), monoglime and diglim can be preferably used.

Furthermore, the organic polar solvents used in the present invention can be used together with the above-described solvents and optionally aromatic hydrocarbon solvents such as benzene, toluene and xylene or other organic solvents such as solvent naphtha, benzonitrile, acetone and methanol.

After the prepolymer is formed, the thermosetting resin composition in the form of the prepolymer is dissolved in an organic solvent to prepare varnish.

Organic solvents which are used in the steps of forming resin sheet from varnish and impregnating a substrate with varnish include solvents used as the varnish solutions mentioned above. Any of organic solvents can be used without particular limitation, so long as the thermosetting resin compositions are uniformly dissolved. The polymerization initiator or the polymerization catalyst is added to varnish to obtain varnish for forming the resin sheet or impregnating the substrate.

The resulting varnish for forming the sheet is cast on a flat sheet by means of an applicator or spin coater and dried at room temperature to 250° C. to obtain a non-tacky resin sheet.

A sheet-form substrate is impregnated with the impregnating varnish and dried at room temperature to 250° C. to obtain a non-tacky prepreg.

The drying temperature is arbitrarily set, depending on the solvent and the polymerization initiator or the polymerization catalyst used, such that the resin sheet or the prepreg becomes B-stage.

Sheet-form materials formed from inorganic fiber or organic fiber are used as the sheet-form substrate. Generally, most of materials used as laminating materials can be used. Examples of the inorganic fiber include various glass fibers such as E glass, C glass, A glass, S glass and D glass formed from $SiO_2$, $Al_2O_3$, etc. and Q glass using quartz. Examples of the organic fiber include aramide fiber formed from high-molecular compounds having an aromatic polyamide-imide skeleton.

Examples of the polymerization initiator or the polymerization catalyst used for varnish include the above-described initiators and catalysts. It is preferred that 0.01 to 10 parts by weight of the polymerization initiator or polymerization catalyst per 100 parts by weight of the thermosetting resin composition is added at the time when the prepolymer is formed or varnish for forming sheet or impregnating the substrate is prepared. However, it is not always necessary to add the polymerization initiator or the polymerization catalyst.

Further, the laminated sheets of the present invention will be illustrated below.

The laminated sheets are formed by laminating the resin sheet and/or prepreg of the present invention or by laminating the resin sheet and/or the prepreg onto a copper foil.

The thus-obtained laminated sheets have high heat resistance and are excellent in through-hole bonding reliability, dimensional stability, processability and electrical characteristics.

General method for preparing the laminated sheets of the present invention is illustrated below.

First, the resin sheet or prepreg of the present invention is prepared in the manner described above. The predetermined number of resin sheets or prepregs are placed in layers. A curing reaction is carried out by heating at a temperature of 100° to 350° C. under a pressure of 1 to 200 kgf/cm² for one minute to 48 hours. If desired, post curing may be carried out at a temperature of 100° to 350° C. for 5 minutes to 48 hours to obtain a laminated sheet.

If desired, the predetermined number of resin sheets or prepreg is laminated onto a copper foil and they are cured under the above-described conditions to obtain a copper-clad laminate.

The prepreg and the resin sheet of the present invention generally has a thickness of 5 to 500 μm, preferably 10 to 300 μm. The laminated sheet generally has a thickness of 10 to 5,000 μm, preferably 50 to 3,000 μm. The thickness of smaller than the above lower limit is not preferred from the viewpoint of dielectric strength, while when the thickness is too large, such thickness is of no practical use from the viewpoint of multi-layer formation.

The thermosetting resin compositions of the present invention have the above-described constitution and the cured products thereof have low dielectric constant and are flexible and excellent in heat resistance. The detailed reasons for these excellent results so far are not known. However, it is considered that when fluorine atoms are introduced into the molecule to increase fluorine content in the molecule, electronic polarizability is lowered by C—F bonds and as a result, dielectric constant is lowered.

Further, it is considered that the main molecular chain of the cured product has specific repeating units and excellent flexibility can be obtained by the zigzag structure of the repeating units and that interaction between molecules is weakened by introducing fluorine atoms into the molecules and as a result, flexibility is improved.

Furthermore, it is considered that steric hindrance is caused by introducing fluorine atoms into the molecule, said fluorine atom being larger than hydrogen atom and as a result, the three-dimensional crosslinked structure of the high-molecular weight material is strengthened and heat resistance is improved.

Particularly, the thermosetting resin compositions of the present invention have good solubility in organic solvents. Therefore, solutions such as varnish can be readily obtained. Molded articles can be easily obtained by casting the solution such as varnish on a flat sheet by means of an applicator and heating it to effect curing. Accordingly, the compositions are very superior in processability.

Further, the thermosetting resin compositions of the present invention have an imide skeleton and can be thermoset to form a three-dimensional crosslinked structure so that the resulting cured products are remarkably superior in dimensional stability to the cured products of general-purpose fluororesins or epoxy resins.

The laminated sheets of the present invention are formed by using the above thermosetting resin compositions so that they have low dielectric constant and low dielectric loss and are excellent in heat resistance.

The present invention is now illustrated in greater detail by reference to the following examples which, however, are not construed as limiting the present invention in any way.

EXAMPLE 1

Into a flask, there were charged 12.89 g (0.040 mol) of 3,4,3',4'-benzophenonetetracarboxylic acid dianhydride (BTDA), 12.01 g (0.060 mol) of 4,4'-diaminodiphenyl ether (4,4'-DDE) and 37.35 g of N-methyl-2-pyrrolidone (NMP). The mixture was stirred in a nitrogen stream at room temperature (not higher than 30° C.) for 12 hours to obtain an amine-terminated amic acid oligomer having a solid concentration of 40.0% by weight. The inherent viscosity (0.5 g/dl in N-methyl-2-pyrrolidone at 30° C., the same conditions being used hereinbelow) was 0.11 (dl/g)

The amic acid solution was stirred for 3 hours while heating it at 145° C. and then stirred at 160° C. for 3 hours to thereby carry out dehydration-cyclizationimidation, thus obtaining an amine-terminated imide oligomer. The inherent viscosity was 0.18 (dl/g) and the imide oligomer solution contained 0.037 mol of amino group (analytical value by potentiometric titration method using perchloric acid; theoretical value: 0.04 mol).

To the resulting imide oligomer solution, there was added 19.11 g (0.028 mol) of 2,2-bis(4-(4-maleimidophenoxy)phenyl)hexafluoropropane (BAPF-MI). The mixture was stirred for 4 hours while heating it at 150° C. to form a prepolymer. The resulting solution was cast on a glass sheet and heated at 150° C. for 2 hours, at 220° C. for 2 hours and further at 300° C. for one hour to obtain a film of 60 μm in thickness. The film had a glass transition temperature of 325° C. and the temperature of 5 wt % weight reduction was 495° C. The relative dielectric constant and dielectric dissipation factor thereof were measured according to JIS C6481 and were found to be 3.35 (1 MHz) and 0.019 (1 MHz), respectively.

EXAMPLES 2 TO 12

The procedure of Example 1 was repeated except that diamines, acid dianhydrides and polymaleimides indicated in Table 1 were used in amounts given in Table 1 to prepare each film.

The results are shown in Table 1.

EXAMPLE 13

Into a flask, there were charged 21.32 g (0.048 mol) of 2,2-bis(3,4-dicarboxyphenyl)hexafluoropropane dianhydride (6FDA), 26.95 g (0.052 mol) of 2,2-bis(4-(4-aminophenoxy)phenyl)hexafluoropropane (BAPF) and 112.63 g of N-methyl-2-pyrrolidone (NMP). The mixture was stirred in a nitrogen stream at a temperature of not higher than 30° C. for 12 hours to obtain an amine-terminated amic acid oligomer having a solid content of 30.0% by weight (inherent viscosity: 0.41 dl/g).

The amic acid solution was then stirred at 145° C. for 2 hours, at 150° C. for 3 hours and further at 160° C. for 2 hours to thereby carry out dehydration-cyclization-imidation, thus obtaining an amine-terminated imide oligomer. The inherent viscosity was 0.38 dl/g and the imide oligomer solution contained 0.0072 mol of amino group.

To the resulting imide oligomer solution, there were added 17.34 g (0.026 mol) of 2,2-bis(4-(4-maleimidophenoxy)phenyl)hexafluoropropane (BAPF-MI) and 312 g of N-methyl-2-pyrrolidone (NMP). The mixture was stirred at 160° C. for 3 hours and then at 180° C. for 100 minutes to form a prepolymer. The resulting solution was cast on a glass sheet and heated at 100° C. for 4 hours, 220° C. for 14 hours, at 260° C. for 5 hours and finally at 300° C. for one hour to obtain a film of 80 μm in thickness. The film had a glass transition temperature of 258° C. and the temperature of 5 wt % weight reduction was 485° C. The relative dielectric constant and dielectric dissipation factor thereof were 2.85 (1 MHz) and 0.0053 (1 MHz), respectively.

EXAMPLES 14 TO 29

The procedure of Example 13 was repeated except that diamines, acid dianhydrides and polymaleimides indicated in Table 1 were used in amounts given in Table 1 to prepare each film.

The results are shown in Table 1.

EXAMPLE 30

Into a flask, there were charged 21.78 g (0.049 mol) of 2,2-bis(3,4-dicarboxyphenyl)hexafluoropropane dianhydride (6FDA), 33.36 g (0.051 mol) of 2,2-bis(4-(4-amino-2-trifluoromethylphenoxy)phenyl)hexafluoropropane (DTFA) and 128.66 g of N,N-dimethylacetamide (DMAC). The mixture was stirred in a nitrogen stream at a temperature of not higher than 30° C. for 12 hours to obtain an amine-terminated amic acid oligomer having a solid content of 30.0% by weight (inherent viscosity: 0.59 dl/g).

To the amic acid solution, there was added 30 ml of toluene. The mixture was stirred at 145° C. for 2 hours and then at 155° C. for 4 hours to carry out dehydration, cyclization and imidation, whereby an amine-terminated imide oligomer was obtained. The inherent viscosity was 0.45 dl/g and the imide oligomer solution contained 0.0033 mol of amino group.

To the resulting imide oligomer solution, there was added 26.70 g (0.033 mol) of 2,2-bis(4-(4-maleimido-2-trifluoromethylphenoxy)phenyl)hexafluoropropane (DTFAMI). The mixture was stirred at 160° C. for 2 hours to form a prepolymer. The resulting solution was cast on a glass sheet and heated at 80° C. for one hour, at 130° C. for 3 hours, at 180° C. for 14 hours, at 260° C. for 5 hours and finally at 300° C. for one hour to obtain a film of 60 μm in thickness. The film had a glass transition temperature of 247° C. and the temperature of 5 wt % weight reduction was 452° C. The relative dielectric constant and the dielectric dissipation factor thereof were 2.74 (1 MHz) and 0.0019 (1 MHz), respectively.

EXAMPLES 31 TO 37

The procedure of Example 30 was repeated except that diamines, acid anhydrides and polymaleimides indicated in Table 1 were used in amounts given in Table 1 to prepare each film.

COMPARATIVE EXAMPLES 1 TO 8.

The procedure of Example 1 was repeated except that diamines, acid dianhydrides and polyamides indicated in Table 1 were used in amounts given in Table 1 to prepare each film.

The results are shown in Table 1.

cyclization and imidation, thus obtaining an amine-terminated imide oligomer (inherent viscosity: 0.15 dl/g).

To the resulting imide solution, there were added

TABLE 1

| | Diamine | Acid dianhydride | Diamine:Acid dianhydride (molar ratio) | Inherent viscosity* η (30° C.) (dl/g) | Polymaleimide kind | Amount (phr) | Tg (°C.) | Temp. of 5 wt % weight reduction | Specific dielectric constant ε | Dielectric loss tan δ | Solvent resistance NMP | Solvent resistance acetone |
|---|---|---|---|---|---|---|---|---|---|---|---|---|
| Ex. 1 | 4,4'-DDE | BTDA | 6:4 | 0.11 | BAPF-MI | 80 | 309 | 432 | 3.35 | 0.019 | ○ | ○ |
| Ex. 2 | 3,3'-DDS | BPDA | 6:4 | 0.12 | ATAF-MI | 40 | 324 | 438 | 3.38 | 0.018 | ○ | ○ |
| Ex. 3 | BAPF | BTDA | 6:4 | 0.13 | DAM-MI | 100 | 316 | 431 | 3.39 | 0.022 | ○ | ○ |
| Ex. 4 | BAPP | 6FDA | 5.2:4.8 | 0.19 | 3,3'-DDS-MI | 50 | 305 | 459 | 3.28 | 0.016 | ○ | ○ |
| Ex. 5 | BAPF | 6FDA | 5.3:4.7 | 0.25 | BAPP-MI | 20 | 254 | 475 | 3.06 | 0.0085 | ○ | △ |
| Ex. 6 | DTFA | BPDA | 5.3:4.7 | 0.21 | DTFA-MI | 200 | 295 | 425 | 3.09 | 0.0092 | ○ | △ |
| Ex. 7 | DAM | 6FDA | 7:3 | 0.07 | BAPF-MI | 500 | 321 | 416 | 3.25 | 0.020 | ○ | ○ |
| Ex. 8 | 3,3'-BAPS | 6FDA | 5.2:4.8 | 0.23 | BAPF-MI | 50 | 285 | 469 | 2.94 | 0.0082 | ○ | ○ |
| Ex. 9 | BAPF | 6FDA | 7:3 | 0.08 | BAPF-MI | 50 | 260 | 426 | 3.22 | 0.0091 | ○ | ○ |
| Ex. 10 | BAPF | 6FDA | 6:4 | 0.15 | BAPF-MI | 50 | 283 | 442 | 3.02 | 0.0083 | ○ | ○ |
| Ex. 11 | BAPF | 6FDA | 5.5:4.5 | 0.20 | BAPF-MI | 50 | 265 | 465 | 2.87 | 0.0075 | ○ | ○ |
| Ex. 12 | BAPF | 6FDA | 5.2:4.8 | 0.38 | BAPF-MI | 20 | 250 | 482 | 2.91 | 0.0074 | ○ | △ |
| Ex. 13 | BAPF | 6FDA | 5.2:4.8 | 0.38 | BAPF-MI | 50 | 258 | 485 | 2.85 | 0.0053 | ○ | ○ |
| Ex. 14 | BAPF | 6FDA | 5.2:4.8 | 0.38 | BAPF-MI | 100 | 271 | 444 | 2.93 | 0.0079 | ○ | ○ |
| Ex. 15 | BAPF | 6FDA | 5.5:4.5 | 0.20 | BAAF-MI | 100 | 269 | 436 | 2.79 | 0.0027 | ○ | ○ |
| Ex. 16 | BAPF | 6FDA | 5.5:4.5 | 0.20 | ATAF-MI | 100 | 275 | 450 | 2.83 | 0.0018 | ○ | ○ |
| Ex. 17 | BAPF | 6FDA | 5.3:4.7 | 0.25 | ATAF-MI | 50 | 245 | 450 | 2.74 | 0.0017 | ○ | ○ |
| Ex. 18 | BAPF | 6FDA | 5.3:4.7 | 0.25 | ATAF-MI | 100 | 251 | 440 | 2.78 | 0.0018 | ○ | ○ |
| Ex. 19 | BAAF | 6FDA | 5.3:4.7 | 0.19 | ATAF-MI | 50 | 295 | 448 | 2.76 | 0.0020 | ○ | ○ |
| Ex. 20 | BAAF | 6FDA | 5.1:4.9 | 0.44 | ATAF-MI | 50 | 306 | 470 | 2.70 | 0.0015 | △ | △ |
| Ex. 21 | ATAF | 6FDA | 5.3:4.7 | 0.30 | ATAF-MI | 50 | 278 | 476 | 2.70 | 0.0018 | ○ | ○ |
| Ex. 22 | ATAF | 6FDA | 5.3:4.7 | 0.30 | ATAF-MI | 100 | 285 | 468 | 2.74 | 0.0015 | ○ | ○ |
| Ex. 23 | BAAF | 6FDA | 5.3:4.7 | 0.19 | BAPF-MI | 50 | 304 | 459 | 2.86 | 0.0028 | ○ | ○ |
| Ex. 24 | BAAF | 6FDA | 5.1:4.9 | 0.44 | BAAF-MI | 50 | 317 | 487 | 2.76 | 0.0015 | △ | △ |
| Ex. 25 | DTFA | 6FDA | 5.5:4.5 | 0.16 | DTFA-MI | 50 | 286 | 433 | 3.01 | 0.0031 | ○ | ○ |
| Ex. 26 | DTFA | 6FDA | 5.3:4.7 | 0.20 | DTFA-MI | 20 | 233 | 449 | 2.72 | 0.0011 | ○ | △ |
| Ex. 27 | DTFA | 6FDA | 5.3:4.7 | 0.20 | DTFA-MI | 50 | 256 | 441 | 2.86 | 0.0025 | ○ | ○ |
| Ex. 28 | DTFA | 6FDA | 5.3:4.7 | 0.20 | DTFA-MI | 100 | 271 | 424 | 2.93 | 0.0034 | ○ | ○ |
| Ex. 29 | DTFA | 6FDA | 5.3:4.7 | 0.20 | BAPF-MI | 50 | 289 | 455 | 2.79 | 0.0028 | ○ | ○ |
| Ex. 30 | DTFA | 6FDA | 5.1:4.9 | 0.45 | DTFA-MI | 50 | 247 | 452 | 2.74 | 0.0019 | △ | △ |
| Ex. 31 | DTFA | 6FDA | 5.1:4.9 | 0.45 | DTFA-MI | 500 | 289 | 404 | 3.31 | 0.010 | ○ | ○ |
| Ex. 32 | BAPF | 3BPF | 5.2:4.8 | 0.34 | BAPF-MI | 50 | 245 | 468 | 2.79 | 0.0046 | ○ | ○ |
| Ex. 33 | BAPF | 4BPF | 5.2:4.8 | 0.39 | BAPF-MI | 50 | 251 | 475 | 2.71 | 0.0021 | ○ | ○ |
| Comp. Ex. 1 | 4,4'-DDE | BTDA | 5.5:4.5 | 0.18 | DAM-MI | 75 | 325 | 495 | 3.76 | 0.015 | ○ | ○ |
| Comp. Ex. 2 | DAM | BTDA | 6:4 | 0.13 | DAM-MI | 100 | 334 | 488 | 3.97 | 0.022 | ○ | ○ |
| Comp. Ex. 3 | 3,3'-BAPS | BPDA | 7:3 | 0.07 | BAPP-MI | 500 | 341 | 420 | 3.82 | 0.020 | ○ | ○ |
| Comp. Ex. 4 | 3,3'-DDS | BPDA | 5.5:4.5 | 0.19 | 3,3'- | 50 | 322 | 503 | 3.58 | 0.015 | ○ | ○ |
| Ex. 34 | BAPF | 6FDA | 8:2 | 0.004 | BAPF-MI | 50 | 222 | 348 | 3.29 | 0.028 | ○ | ○ |
| Ex. 35 | BAPF | 6FDA | 5.3:4.7 | 0.25 | BAPF-MI | 10 | 260 | 492 | 2.86 | 0.0065 | X | X |
| Ex. 36 | BAPF | 6FDA | 5.3:4.7 | 0.25 | BAPF-MI | 700 | 275 | 412 | 3.45 | 0.021 | ○ | ○ |
| Ex. 37 | BAPF | 6FDA | 5.02:4.98 | 1.05 | BAPF-MI | 50 | 251 | 498 | 2.70 | 0.0025 | X | X |

Solvent resistance: Measuring conditions: visual observation after immersion of room temperature (25° C.) for 4 hours
○: not dissolved,
△: slightly dissolved,
X: completely dissolved.
*: Inherent viscosity of the amic acid In Table 1, the amounts of the polymaleimide are represented in terms of part by weight per 100 parts by weight of the amine-terminated imide oligomer.

EXAMPLES 34 TO 49

Into a flask, there were charged 172.8 g (0.389 mol) of 2,2-bis(3,4-dicarboxyphenyl)hexafluoropropane dianhydride (6FDA), 227.3 g (0.439 mol) of 2,2-bis(4-(4-aminophenoxy)phenyl)hexafluoropropane (BAPF) and 933.3 g of N-methyl-2-pyrrolidone. The mixture was stirred in a nitrogen stream at room temperature of not higher than 30° C. for 12 hours to obtain an amine-terminated amic acid oligomer having a solid concentration of 30.0% by weight (inherent viscosity: 0.25 dl/g).

The resulting amic acid solution was then stirred at 155° C. for 3 hours to thereby carry out dehydration, polymaleimide indicated in Table 2 and N-methyl-2-pyrrolidone (NMP) in such an amount as to give a predetermined solid concentration.

The mixture was then stirred under prepolymer forming conditions indicated in Table 2 to form a prepolymer. The resulting solution was cast on a glass sheet and heated at 150° C. for 2 hours and then at 260° C. for one hour to obtain a film of 100 μm in thickness.

The results are shown in Table 2.

COMPARATIVE EXAMPLES 5 TO 8

The procedure of Examples 34 to 39 was repeated except that prepolymer forming conditions indicated in Table 2 were used.

The results are shown in Table 2.

TABLE 2

| | Polymaleimide kind | Amount (phr) | Solid concn. (wt %) | Prepolymer forming Condition | State after formation of Prepolymer | Tg (°C.) | Temp. of 5 wt % weight reduction (°C.) | Specific dielectric constant ε | Dielectric loss tan δ | Solvent resistance NMP | acetone |
|---|---|---|---|---|---|---|---|---|---|---|---|
| Ex. 34 | MPA-MI | 100 | 40 | 160° C. × 1 hr. | Δ | 264 | 441 | 3.22 | 0.014 | ○ | ○ |
| Ex. 35 | MPA-MI | 100 | 40 | 180° C. × 1 hr. | ○ | 275 | 437 | 3.17 | 0.015 | ○ | ○ |
| Ex. 36 | PPA-MI | 100 | 40 | 160° C. × 1 hr. | Δ | 271 | 445 | 3.25 | 0.016 | ○ | ○ |
| Ex. 37 | PPA-MI | 100 | 40 | 180° C. × 1 hr. | ○ | 279 | 439 | 3.24 | 0.017 | ○ | ○ |
| Ex. 38 | TDA-MI | 100 | 40 | 160° C. × 1 hr. | ○ | 257 | 428 | 3.23 | 0.015 | ○ | ○ |
| Ex. 39 | DAM-MI | 100 | 40 | 160° C. × 1 hr. | ○ | 256 | 428 | 3.28 | 0.015 | ○ | ○ |
| Ex. 40 | 3,3'-DDS-MI | 100 | 40 | 160° C. × 1 hr. | ○ | 253 | 434 | 3.18 | 0.013 | ○ | ○ |
| Ex. 41 | BAPF-MI | 100 | 10 | 180° C. × 1 hr. | ○ | 232 | 455 | 2.89 | 0.0044 | ○ | ○ |
| Ex. 42 | BAPF-MI | 100 | 40 | 180° C. × 1 hr. | ○ | 235 | 453 | 2.88 | 0.0047 | ○ | ○ |
| Ex. 43 | BAPF-MI | 100 | 100 | 180° C. × 1 hr. | ○ | 248 | 439 | 2.81 | 0.0049 | ○ | ○ |
| Ex. 44 | BAAF-MI | 100 | 40 | 160° C. × 1 hr. | Δ | 269 | 432 | 2.79 | 0.0027 | ○ | ○ |
| Ex. 45 | BAAF-MI | 100 | 40 | 180° C. × 1 hr. | ○ | 269 | 436 | 2.79 | 0.0027 | ○ | ○ |
| Ex. 46 | BAAF-MI | 50 | 40 | 160° C. × 1 hr. | ○ | 259 | 454 | 2.78 | 0.0026 | ○ | ○ |
| Ex. 47 | BAAF-MI | 50 | 40 | 180° C. × 1 hr. | ○ | 261 | 451 | 2.76 | 0.0033 | ○ | ○ |
| Ex. 48 | ATAF-MI | 100 | 40 | 100° C. × 15 hr. | ○ | 285 | 451 | 2.75 | 0.0028 | ○ | ○ |
| Ex. 49 | ATAF-MI | 100 | 100 | 230° C. × 5 min. | ○ | 289 | 443 | 2.76 | 0.0022 | ○ | ○ |
| Comp. Ex. 5 | MPA-MI | 50 | 40 | 40° C. × 20 hr. | X | * | * | * | * | * | * |
| Comp. Ex. 6 | MPA-MI | 100 | 100 | 260° C. × 5 min. | gelation | * | * | * | * | ○ | ○ |
| Comp. Ex. 7 | ATAF-MI | 50 | 40 | 40° C. × 20 hr. | X | * | * | * | * | X | X |
| Comp. Ex. 8 | ATAF-MI | 100 | 100 | 260° C. × 5 min. | gelation | * | * | * | * | ○ | ○ |

State after formation of prepolymer: state after cooling to room temp. (25° C.)
○: Uniform composition,
Δ: Crystal was partially precipitated,
X: A large amount of crystal was precipitated.
*: Measurement could not be made, because uniform cured product could not be obtained.
Abbreviation:
DAM: 4,4'-diaminodiphenylmethane
3,3'-BAPS: bis(4-(3-aminophenoxy)phenyl)sulfone
3,3'-DDS: 3,3'-diaminodiphenyl sulfone
BAPP: 2,2-bis(4-(4-aminophenoxy)phenyl)propane
BAAP: 2,2-bis(4-aminophenyl)hexafluoropropane
ATAP: 2,2-bis(3-amino-4-methylphenyl)hexafluoropropane
BPDA: 3,3',4,4'-diphenyltetracarboxylic acid dianhydride
3BPF: 2,2-bis(3-(3,4-dicarboxyphenoxy)phenyl)hexafluoropropane dianhydride
4BPF: 2,2-bis(4-(3,4-dicarboxyphenoxy)phenyl)hexafluoropropane dianhydride
BAPP-MI: 2,2-bis(4-(4-maleimidophenoxy)phenyl)propane
3,3'-DDS-MI: N,N-(3,3'-diphenylsulfone)bismaleimide
BAAF-MI: 2,2-bis(4-maleimidophenyl)hexafluoropropane
ATAF-MI: 2,2-bis(3-maleimido-4-methylphenyl)hexafluoropropane
4,4'-DDE: 4,4'-diaminodiphenyl ether
DTFA: 2,2-bis(4-(4-amino-2-trifluoromethylphenoxy)phenyl)hexafluoropropane
BAPF: 2,2-bis(4-(4-aminophenoxy)phenyl)hexafluoropropane
BTDA: 3,4,3',4'-benzophenonetetracarboxylic acid dianhydride
6FDA: 2,2-bis(3,4-dicarboxyphenyl)hexafluoropropane dianhydride
DAM-MI: N,N'-(4,4'-diphenylmethane)bismaleimide
BAPF-MI: 2,2-bis(4-(4-maleimidophenoxy)phenyl)hexafluoropropane
DTFA-MI: 2,2-bis(4-(4-maleimido-2-trifluoromethylphenoxy)phenyl)hexafluoropropane
MPA-MI: N,N'-m-phenylenebismaleimide
PPA-MI: N,N'-p-phenylenebismaleimide
TDA-MI: 2,4-dimaleimidotoluene.

EXAMPLE 50

Into a flask, there were charged 172.8 g (0.389 mol) of 2,2-bis(3,4-dicarboxyphenyl)hexafluoropropane dianhydride (6FDA) 227.3 g (0.439 mol) of 2,2-bis(4-(4-aminophenoxy)phenyl)hexafluoropropane (BAPF) and 933.3 g of N-methyl-2-pyrrolidone (NMP). An amino-terminated oligomer was formed therefrom by heat imidation reaction.

To the resulting imide oligomer solution, there were added 386.1 g (0.781 mol) of 2,2-bis(4-maleimidophenyl)hexafluoropropane (BAAF-MI) and 500 g of NMP. The mixture was stirred at 180° C. for one hour to form a prepolymer.

To the resulting solution, there were added 2.56 g (0.007 mol) of benzopinacol and 1.31 g (0.005 mol) of triphenylphosphine to prepare an impregnating varnish.

Glass cloth having a thickness of 100 μm and a basis weight of 103 g/m² was impregnated with the varnish in such an amount as to give an impregnating ratio of 60 wt %, and the impregnated glass cloth was dried at 210° C. for 10 minutes to obtain a prepreg.

Three sheets of the prepregs were placed in layers, and an electrolytic copper foil was laminated onto each of the upper and lower sides thereof. The laminated was heated at 250° C. under a pressure of 50 kgf/cm² for one hour to obtain a good copper-clad laminate.

The relative dielectric constant and dielectric dissipation factor of the laminate were 3.3 (1 MHz) and 0.003 (1 MHz), respectively. The bond strength of the copper foil was 1.3 kg/cm at 25° C.

EXAMPLE 51

Into a flask, there were charged 399.8 g (0.900 mol) of 2,2-bis(3,4-dicarboxyphenyl)hexafluoropropane dianhydride (6FDA), 699.5 g (1.350 mol) of 2,2-bis(4-(4-aminophenoxy)phenyl)hexafluoropropane (BAPF) and 2565 g of N-methyl-2-pyrrolidone (NMP). An amino-terminated oligomer was formed therefrom by heat imidation reaction.

To the resulting amine-terminated imide oligomer solution, there were added 470.2 g (0.900 mol) of 2,2-bis(3-maleimido-4-methylphenyl)hexafluoropropane (ATAFMI) and 11.0 g (0.0450 mol) of tridecanedicarboxylic acid. The mixture was stirred at 180° C. for 2 hours to form a prepolymer, thus obtaining varnish.

The resulting varnish was cast on a glass sheet by means of an applicator and dried at 120° C. for one hour and then at 210° C. for 20 minutes to obtain a resin sheet having a thickness of 60 to 80 μm and a low dielectric constant.

The specific dielectric constant and dielectric dissipation factor of the resin sheet were 2.73 (1 MHz) and 0.0027 (1 MHz), respectively.

Aramide cloth (thickness: 55 μm, manufactured by Teijin Ltd.) was impregnated with said varnish in such an amount as to give an impregnating ratio of 70 wt %. The impregnated cloth was dried at 210° C. for 20 minutes to obtain a prepreg. Three sheets of the prepregs were placed in layers. A copper foil of 18 μm was laminated onto each of both sides thereof, and the laminate was heated at 280° C. under a pressure of 50 kgf/cm² for 2 hours to obtain an integrated copper-clad (both sides) laminate (thickness: 250 μm). Further, the laminate was etched to form a circuit pattern, thus obtaining an internal layer.

An internal layer 1, sheets 2 having a low dielectric constant, prepregs 3 and copper foils 4 (thickness: 18 μm) were laminated as shown in FIG. 1. The laminate was heated at 260° C. under a pressure of 50 kgf/cm² for 2 hours to prepare an integral laminated sheet (multilayer circuit board).

Resistance to heat of soldering the laminated sheet (multi-layer circuit board) was found to be good after immersion at 300° C. for 2 minutes. strength of the copper foil was 1.4 kg/cm at 25° C.

The thermosetting resin compositions of the present invention contain amine-terminated oligomers having a specific structure and polymaleimides having a specific structure. Molded articles obtained by reacting them by heating to crosslink and cure them are excellent in heat resistance and flexibility and have low dielectric constant-low dielectric loss properties. Further, the molded articles are excellent in heat resistance, through-hole bonding reliability, dimensional stability and electrical characteristics in particular. Accordingly, the thermosetting resin compositions of the present invention have effects of realizing the larger capacity and smaller-sized weight reduction of electrical and electronic apparatuses and computers or speeding-up, higher reliability and higher density of signal transfer speed.

While the present invention has been described in detail and with reference to specific embodiments thereof, it is apparent to one skilled in the art that various changes and modifications can be made therein without departing from the spirit and the scope of the present invention.

What is claimed is:

1. A thermosetting resin composition comprising (A) an amine-terminated oligomer represented by formula (I):

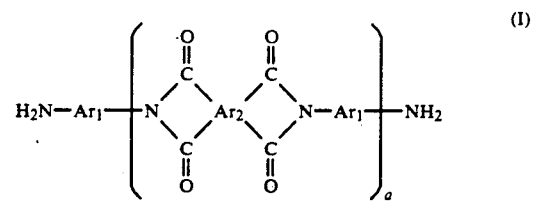

wherein $Ar_1$ represents a divalent aromatic group, $Ar_2$ represents a tetravalent aliphatic or aromatic group and a represents an integer of at least 1; and (B) a polymaleimide represented by formula (II):

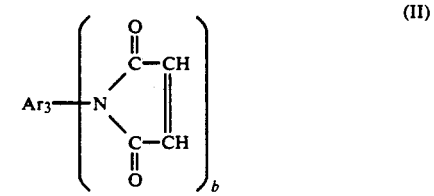

wherein $Ar_3$ represents an aliphatic group having two or more carbon atoms or an aromatic group and b represents an integer of at least 2, provided that at least one group of $Ar_1$, $Ar_2$ and $Ar_3$ in formulae (I) and (II) is a perfluorogroup.

2. A thermosetting resin composition as claimed in claim 1, wherein $Ar_1$ and $Ar_3$ in formulae (I) and (II) each represent a group represented by formula (III):

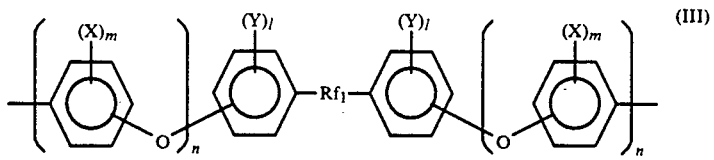

wherein $Rf_1$ represents a perfluoroalkylene group, X and Y are the same or different and each represents at least one member selected from the group consisting of an alkyl group and a fluorinated alkyl group, n represents 0 or 1, m represents an integer of 0 to 4 and l represents an integer of 0 to 4.

3. A thermosetting resin composition as claimed in claim 1, wherein $Ar_2$ in formula (I) represents a group represented by the following formula

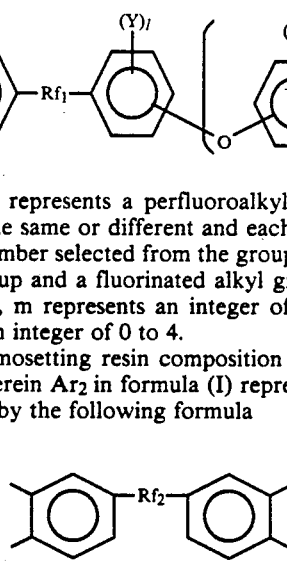

wherein $Rf_2$ represents a member selected from the group consisting of a perfluoroalkylene group $$\begin{array}{c} CF_3 \\ | \\ -C-, \\ | \\ CF_3 \end{array}$$

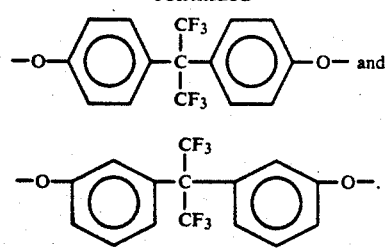

4. A thermosetting resin composition as claimed in claim 1, wherein the amine-terminated oligomer (A) of formula (I) and the polymaleimide (B) of formula (II) are blended such that the amount of the component (B) is 20 to 500 parts by weight per 100 parts by weight of the component (A).

5. A thermosetting resin composition as claimed in claim 1, wherein the inherent viscosity of said amine-terminated oligomer is not higher than 1.0 dl/g and said inherent viscosity is calculated by the following formula wherein viscosity is measured by a capillary viscometer (0.5 (g/dl) in N-methyl-2-pyrrolidone at 30° C.):

$$\text{Inherent viscosity} = \frac{\text{Natural logarithm} \frac{(\text{viscosity of solution})}{(\text{viscosity of solvent})}}{\text{Concentration of polymer in solution}}$$

* * * * *